United States Patent
Heerens et al.

(10) Patent No.: US 7,153,612 B2
(45) Date of Patent: Dec. 26, 2006

(54) MASK HANDLING METHOD, AND MASK AND DEVICE OR APPARATUS COMPRISING A GRIPPER THEREFOR, DEVICE MANUFACTURING METHOD AND DEVICE MANUFACTURED THEREBY

(75) Inventors: Gart-Jan Heerens, Schoonhoven (NL); Erik Leonardus Ham, Rotterdam (NL); Bastiaan Lambertus Wilhemus Marinus Van De Ven, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 398 days.

(21) Appl. No.: 10/084,656

(22) Filed: Feb. 28, 2002

(65) Prior Publication Data

US 2003/0162101 A1     Aug. 28, 2003

(30) Foreign Application Priority Data

Mar. 1, 2001    (EP) .................................. 01301864

(51) Int. Cl.
   *G01F 9/00*    (2006.01)
   *G03B 27/58*   (2006.01)

(52) U.S. Cl. ............................................. 430/5; 355/72

(58) Field of Classification Search ................ 414/788, 414/788.7, 792.9; 430/311, 5, 22; 355/72, 355/77
   See application file for complete search history.

(56) References Cited

U.S. PATENT DOCUMENTS 4,610,020 A     9/1986   La Fiandra et al.
5,608,773 A  *  3/1997   Korenaga et al. ............. 378/34
6,172,738 B1    1/2001   Korenaga et al.
6,717,159 B1 *  4/2004   Novak ...................... 250/492.2

FOREIGN PATENT DOCUMENTS

| EP | 0 789 280 A2 | 8/1997 |
| EP | 0 881 538 A2 | 12/1998 |
| EP | 1 061 561 A1 | 12/2000 |
| JP | 9-213626 A | 8/1997 |
| WO | WO 00/51172 | 8/2000 |

OTHER PUBLICATIONS

"Photomasks with Integral Lasers Mirrors and Calibration of Integral Laser Mirrors on Photomasks," IBM Technical Disclosure Bulletin 32(5B):19-21 (Oct. 1989).
A copy of the European Search Report dated Sep. 6, 2001, issued in the corresponding European Application No. EP 01 30 1864.
English translation of a Korean Office Action in Korean Application No. 10-2002-0010658, dated Sep. 28, 2005.
Moore et al., Building Scientific Apparatus, A Practical Guide to Design and Construction, Univ. of Maryland, (1983), 5 pages.

* cited by examiner

*Primary Examiner*—S. Rosasco
(74) *Attorney, Agent, or Firm*—Pillsbury Winthrop Shaw Pittman LLP

(57) ABSTRACT

A mask for use in a lithographic projection apparatus comprises three brackets arranged on the circumference of the mask. The brackets are provided with grooves directed to a common imaginary point and are intend to cooperate with three pins provided on a mask gripper present in a mask handling apparatus or device. Preferably, the pins are provided with a rounded top for insertion in associated grooves of the brackets to provide a kinematically-determined mechanical position of the mask on the gripper.

24 Claims, 5 Drawing Sheets

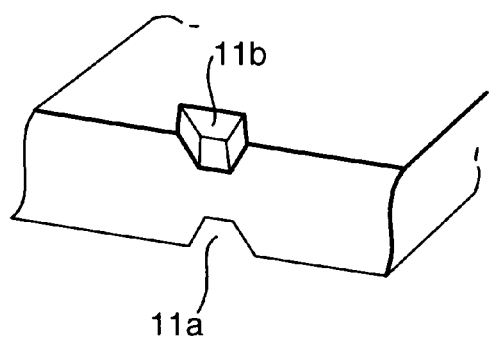
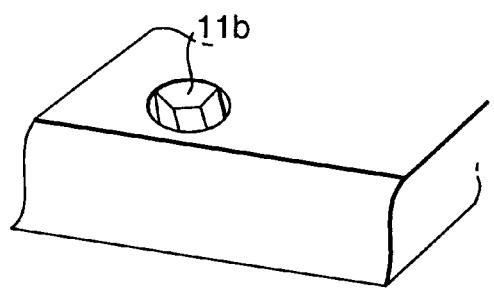
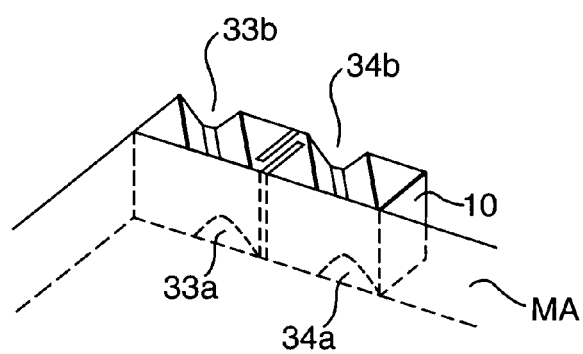
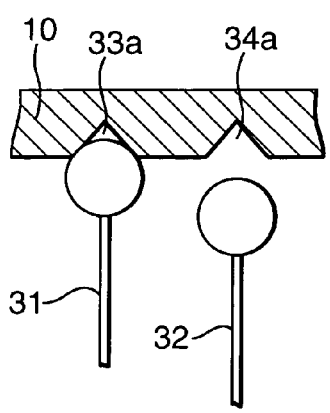
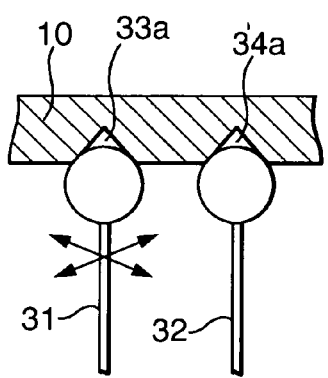
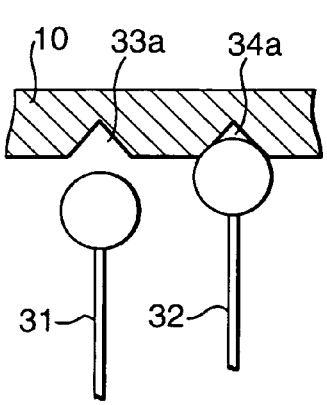

MASK HANDLING METHOD, AND MASK AND DEVICE OR APPARATUS COMPRISING A GRIPPER THEREFOR, DEVICE MANUFACTURING METHOD AND DEVICE MANUFACTURED THEREBY

BACKGROUND OF THE INVENTION

This application claims priority from EP01301864.3 filed Mar. 1, 2001, herein incorporated by reference.

1. Field of the Invention

The present invention relates generally to lithographic apparatus and more particularly to lithographic apparatus using reflective masks.

2. Background of the Related Art

In general, a lithographic extreme ultraviolet radiation lithographic apparatus include, a reflective mask, a gripper to hold the mask, a radiation system for providing the projection beam of extreme ultraviolet electromagnetic radiation, a mask table for holding the reflective mask, the mask serving to pattern the projection beam according to a desired pattern upon reflection of the projection beam at the mask so as to yield a patterned projection beam, a substrate table for holding a substrate and a projection system for projecting the patterned projection beam onto a target portion of the substrate.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, both incorporated herein by reference.

The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask table ensures that the mask can be held at a desired position in the incoming radiation beam, and that it can be moved relative to the beam if so desired.

Conventionally, the mask table has been positioned such that radiation is passed from the illumination system through the mask, the projection system and onto the substrate. Such masks are known as transmissive masks since they selectively allow the radiation from the illumination system to pass through, thereby forming a pattern on the substrate. Such masks must be supported so as to allow the transmission of light therethrough. This has conventionally been achieved by using a vacuum in the table at a perimeter zone of the mask so that the atmospheric air pressure clamps the mask to the table.

In a lithographic apparatus the size of features that can be imaged onto the wafer is limited by the wavelength of the projection radiation. To produce integrated circuits with a higher density of devices, and hence higher operating speeds, it is desirable to be able to image smaller features. While most current lithographic projection apparatus employ ultraviolet light of 365 nm, 248 nm and 193 nm generated by mercury lamps or excimer lasers, it has been proposed to use shorter wavelength radiation of around 13 nm. Such radiation is termed extreme ultraviolet (EUV) radiation and possible sources include laser-produced plasma sources, discharge sources or synchrotron radiation sources, examples of which are, for instance, disclosed in European patent applications EP 1 109 427 A and EP 1 170 982 A, incorporated herein by reference.

Since no materials are known to date to be sufficiently transparent to EUV radiation, a lithographic projection apparatus employing EUV radiation is envisaged to employ a reflective mask having a multilayer coating of alternating layers of different materials, for instance, in the order of 50 periods of alternating layers of molybdenum and silicon or other materials, such as, for instance, disclosed in European patent application EP 1 065 532 A, incorporated herein by reference. The size of the features to be imaged in EUV lithography makes the imaging process very sensitive to any contamination present on the mask. It is foreseen that any contaminant particles having a dimension in the order of 50 nm will result in defects present in devices fabricated in the substrate. Conventionally, the patterned side of the reticle is covered by a so-called pellicle. Any contamination will then accumulate on the pellicle surface at some distance from the mask pattern and will therefore not be (sharply) imaged onto the substrate, making such masks having pellicles less sensitive to contamination. Pellicles cannot be employed for EUV radiation since they will not be sufficiently transparent to EUV radiation. Particle contamination on the pattern-bearing reflective surface of the mask would therefore lead to defective devices fabricated and must be prevented.

Further, the reflective mask is envisaged to be held at its backside on the mask table by electrostatic forces on a mask-bearing surface to be able to meet the very stringent requirements for EUV mask positioning. Any contaminant particles present in between the backside of the mask and the mask-bearing surface of the mask table will result in irregularities of the reflective mask surface. Since the projection system will be non-telecentric on the object side because a reflective mask is used (more information on this problem can be derived from European patent application EP 1 139 176 A, incorporated herein by reference), any irregularity in the surface figure of the reflective mask surface will translate into a local shift of the pattern imaged onto the substrate. As a result, the imaged layer may not line up with earlier layers that have been processed in the substrate, again leading to defective devices fabricated. Therefore, particle contamination on the backside surface of the mask must be prevented.

Handling of the mask is required to bring it into and out of various types of equipment, such as multilayer deposition equipment, mask pattern write equipment, mask inspection equipment, lithographic projection apparatus, but also a mask storage box to be able to transport the mask between these various types of equipment. Further, inside the various types of equipment, handling of the mask is required, for instance, to take the mask to a mask table for processing, to store it in a mask library and to take the mask out again. Conventionally, a mask is held in handling procedures by a mechanical or vacuum-operated clamp. Such conventional methods appear to constitute a large source of particle generation each time a mask is taken over by another gripper of some handling device. It has been found that gripping will cause particles of various sizes to become released from the gripping area. The inventors have determined that microslip of the contacting surfaces seems a major cause for such particle generation. The inventors have further determined that a more delicate handling method is therefore required for EUV masks and that any mechanical contact between mask and a gripper should be designed such that particle generation during handling and take-over of the mask (reticle) is largely minimized or prevented.

Proper alignment of the mask is often required in the various types of above equipment. Conventionally, this is achieved by clamping the mask, determining alignment, releasing the clamp, adjusting the position of the mask using another gripper, clamping the mask again with the first clamp, determining alignment again, and keep repeating this sequence until satisfactory alignment has been achieved. Particles will be generated each time the mask is clamped and unclamped and an improved method of handling the mask is required to alleviate this problem.

SUMMARY OF THE INVENTION

One embodiment of the present invention includes a method of handling a reflective mask suitable for patterning a projection beam of extreme ultraviolet electromagnetic radiation in a lithographic projection apparatus, wherein said method comprises kinematically-determined holding said mask while handling, said kinematically-determined holding comprising cooperation of a set of protrusions provided on a gripper with a respective set of recesses provided in a circumferential region of the mask. Handling the mask in such a manner both provides for a delicate gripping to prevent particle generation and yields a known alignment of the mask with respect to the gripper so that multiple take-overs are not required to achieve proper alignment. Further, it presents a very simple and uncomplicated way of holding the mask, not requiring any need for sensors to determine proper alignment, which is an advantage in a vacuum environment necessary in most types of equipment for processing an EUV mask. Recesses having a predominant V-shape in their cross-section and cooperating with protrusions having rounded tops have shown to yield very good results.

In certain embodiments, the method comprises holding the mask by employing a non-contact force, such as gravity or an electromagnetic force, against said set of protrusions at one side of the mask to allow for the minimum number of mechanical contact points between mask and gripper and thus for the minimum number of possible particle generation sources.

An aspect of some embodiments of the invention provides a reflective EUV mask that is suitable for handling by the above method, the mask being provided with a set of recesses in its circumferential region for cooperation with a respective set of protrusions in a gripper so as to kinematically-determined hold said mask while handling.

In another embodiment the set of recesses comprises grooves that are substantially oriented towards a common point to allow for efficient holding and a very good reproducibility of mask placement. Multiple sets of recesses at both the same side and opposite sides of the mask may be provided to allow for take-over from one gripper to another gripper, both grippers having a set of protrusions to allow for kinematically-determined holding of the mask.

In another embodiment the recesses are provided in brackets provided around the mask, which allows the material of the brackets to be specifically selected for particular properties in handling, such as materials having a wear-resistant surface. Machining of recesses into the mask might also not make it possible to achieve the extreme requirements specified for EUV masks, such as flatness specifications. Some safety arrangement may also be incorporated in such brackets to hold the mask on a mask table in some emergency situation, such as power failure when held facing downwards by electrostatic forces against the mask table.

A further aspect of particular embodiments of the invention provides a device or apparatus for handling a reflective mask suitable for patterning a projection beam of extreme ultraviolet electromagnetic radiation in a lithographic projection apparatus, said device or apparatus having a gripper comprising a set of protrusions adapted for cooperation with a respective set of recesses provided in a circumferential region of said mask so as to kinematically-determined hold said mask while handling.

Yet a further aspect of embodiments of the invention provides a device manufacturing method comprising the steps of:

providing a substrate that is at least partially covered by a layer of radiation-sensitive material;

providing a projection beam of extreme ultraviolet radiation using a radiation system;

using a reflective mask to endow the projection beam with a pattern in its cross-section;

projecting the patterned beam of radiation onto a target portion of the layer of radiation-sensitive material; and handling said reflective mask, which comprises kinematically-determined holding said mask, said kinematically-determined holding comprising cooperation of a set of protrusions provided on a gripper with a respective set of recesses provided in a circumferential region of the mask.

Further embodiments of the invention and their advantages are given in the claims and the description below.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm, especially around 13 nm).

BRIEF DESCRIPTION OF THE DRAWINGS

Embodiments of the invention will now be described, by way of example only, with reference to the accompanying schematic drawings, in which like reference numerals indicate like parts, and in which:

FIGS. 2b, 2c and 2d depict details of a variation of the mask of FIG. 2a;

FIGS. 5a, 5b and 5c schematically depicts a take-over sequence of a mask by two grippers according to an embodiment of the invention;

FIG. 10 depicts a detail of a mask frame according to an embodiment of the invention for mounting a mask in.

DETAILED DESCRIPTION

Figure 1:
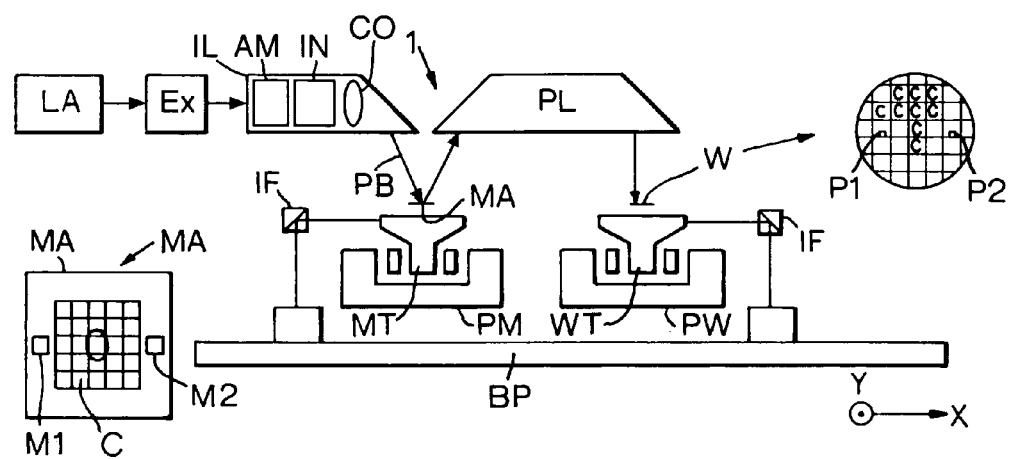
FIG. 1 depicts a lithographic projection apparatus according to an embodiment of the invention.

FIG. 1 schematically depicts a lithographic projection apparatus 1 according to embodiments of the present invention. The apparatus comprises:

a radiation system LA, IL for supplying a projection beam PB of EUV radiation;

a first object table (mask table) MT for holding a mask MA (e.g. a reticle), and connected to first positioning apparatus PM for accurately positioning the mask with respect to item PL;

a second object table (substrate table) WT for holding a substrate W (e.g.a resist-coated silicon wafer), and connected to second positioning apparatus PW for accurately positioning the substrate with respect to item PL;

a projection system ("lens") PL for imaging an irradiated portion of the mask MA onto a target portion C (die) of the substrate W. As here depicted, the projection system is of a reflective type, examples of which are, for instance, disclosed in European patent application EP 01309353.9, incorporated herein by reference.

The source LA (e.g. a laser-produced plasma source, a discharge source, or an undulator or wiggler provided around the path of an electron beam in a storage ring or synchrotron) produces a beam of EUV radiation. This beam is fed into an illumination system (illuminator) IL, either directly or after having traversed a conditioner, such as a beam expander, for example. The illuminator IL may comprise adjustable members for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired intensity distribution in its cross-section.

It should be noted with regard to FIG. 1 that the source LA may be within the housing of the lithographic projection apparatus, but that it may also be remote from the lithographic projection apparatus, the radiation beam which it produces being led into the apparatus (e.g. with the aid of suitable directing mirrors). The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning apparatus (and interferometric measuring apparatus IF), the substrate table WT can be moved accurately, e.g. so as to position different target portions C in the path of the beam PB. Similarly, the first positioning apparatus can be used to accurately position the mask MA with respect to the path of the beam PB, e.g. after mechanical retrieval of the mask MA from a mask library or during a scan. In general, movement of the object tables MT, WT will be realized with the aid of a long-stroke module (course positioning) and a short-stroke module (fine positioning), which are not explicitly depicted in FIG. 1.

The depicted apparatus can be used in two different modes:

In step mode, the mask table MT is kept essentially stationary, and an entire mask image is projected at once (i.e.

a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2A:
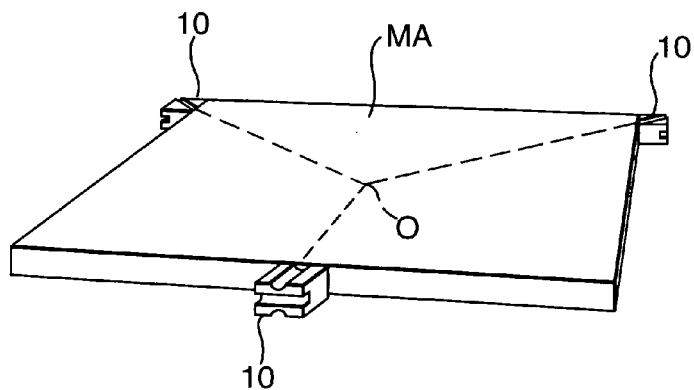
FIG. 2a depicts a mask according to an embodiment of the invention.

FIG. 2a shows mask MA for use in the lithographic apparatus of FIG. 1. The mask is provided with a mask gripping arrangement taking the form of three brackets 10 attached to the circumference of the mask to grip the mask at for holding and handling the mask. The brackets may be attached by any suitable means to the mask and are in the present embodiment attached using a vacuum-compatible glue such as an epoxy-based glue. However, brackets 10, or the gripping arrangement in general, may also constitute an integral part of the mask.

The location of the brackets on the mask has been chosen such as is convenient for handling the mask by mask manufacturers and mask users. They all will have their demands on the space around the mask that is available to arrange the brackets for their purposes. Further, the brackets are shown to be U-shaped in FIGS. 2a and 3.

As can better be seen in FIG. 3, the brackets are provided with grooves 11a, 11b in the top-side and bottom-side surfaces, respectively, that are substantially in line with the pattern-bearing and backside surfaces of the mask, but may also be provided above or below those surfaces. The grooves are directed to an imaginary point O that substantially coincides with a center point on a respective surface of the mask mask. In alternative embodiments such an imaginary point may be located within, below or above the mask, the grooves making an angle with the surfaces of the mask in such a configuration.

Figure 3:
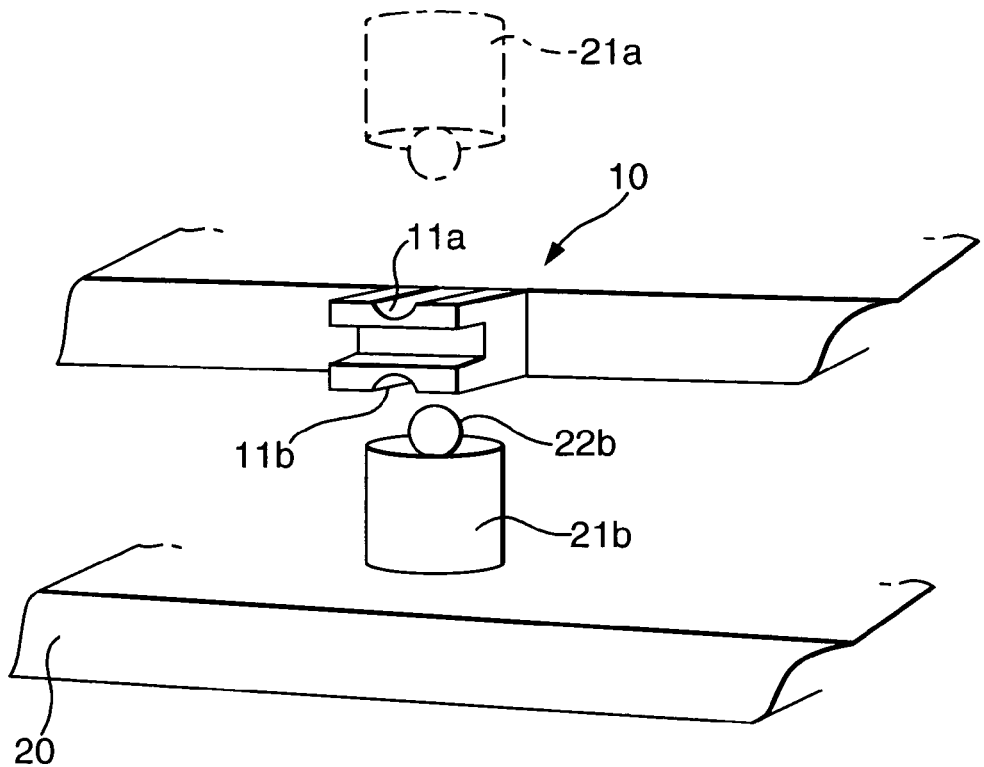
FIG. 3 depicts a detail of FIG. 2a and part of a mask gripper according to the invention.

FIG. 3 also shows part of a mask gripper 20 for gripping mask MA in a mask handling part of the lithographic apparatus shown in FIG. 1. Device 20 comprises three pins 21b that are positioned on the gripper such that they can cooperate with three associated grooves provided in the three brackets of the above mask. It is seen that each pin 21b is provided with a ball 22b at its top. When the mask is held by gravity on the ball pins of the gripping device, the pins will be partially inserted into grooves 11b. Since the grooves are directed to a common point O, this results in a simple, but very effective and accurate kinematic positioning of the mask with respect to the gripping device. Since the configuration allows the mask to be accurately positioned on the gripping device, such a device 20 present in the handling system for masks or in a box for containing a mask can be made very simple, saving costs and improving reliability. Further, such a configuration of grooves and (ball) pins for gripping the mask provides a minimum of microslip, which is a cause of particle generation by mechanical contact. The rounded surface presented by the ball provided on the pin proves to be advantageous in this respect.

When handling the mask with the above gripping device, the mask remains fixed on the gripping device by partial insertion of the pins in associated grooves provided in the brackets due to gravity. The mask may then be handled using some acceleration forces. The fixation of the mask on the gripping device under acceleration and deceleration forces will be increased by providing grooves that are directed to a common imaginary point located below or above the mask, as discussed above.

Figure 4:
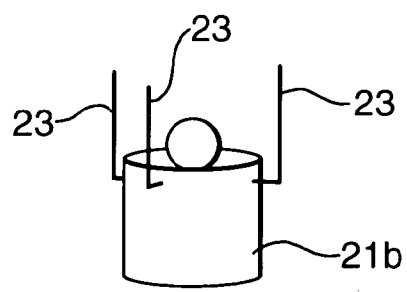
FIG. 4 depicts a variation of the pin of the mask gripper device of FIG. 3.

To improve safety, some safety arrangement as schematically shown in FIG. 4 may be provided. The arrangement consisting of three upwards projecting pins 23 partially encloses a bracket of the mask when positioned on the gripping device, but does not make contact with the bracket, leaving a space between the bracket and the safety arrangement. Such a configuration will prevent the mask from falling off of the gripping device in emergency situations.

To further improve holding of the mask on the gripping device, such as, for instance, in a mask holding box for storing a mask, further pins 21a may be provided above the brackets for insertion in associated grooves in top-side surfaces of the brackets. This is shown in phantom FIG. 3. Pins 21a, 21b should still be lowered and lifted, respectively, as shown in FIG. 3 to grip the mask.

Grooves may also be provided as an integral part of a rectangular shaped mask, i.e. not be provided in brackets. FIGS. 2b and 2c show details of edge regions of a rectangular mask, in which the grooves 11a, 11b are incorporated in the edge region.

FIG. 2d shows a detail of a mask MA having brackets 10 comprising two grooves 33b, 34b in its top surface and two grooves 33a, 34a in its bottom surface. Three brackets 10 are provided around the mask as is shown in FIG. 2a. Four sets of grooves (recesses) are therefore provided, two sets at one side of the mask and two sets at the other side. The mask may be held by a set of pins (protrusions) of one gripper cooperating with one set of grooves of the mask. The other sets of grooves allow the mask to be transferred to another gripper. Such a take-over sequence is shown in FIGS. 5a, 5b and 5c, which show details of a lower part of a bracket 10 with grooves 33a, 34a for cooperation with a protrusion or pin 31 of one gripper (not shown) and a protrusion 32 of another gripper (also not shown), respectively. Each gripper comprises a set of three protrusions 31 or 32. In FIG. 5a it is shown that the mask is held by the first gripper through insertion of protrusion 31 of the first gripper in groove 33a. Subsequently, the second gripper is raised so as to insert its protrusion 32 into groove 34a of bracket 10 attached to the mask, as is shown in FIG. 5b. Holding of the mask is gently taken over from the first gripper to the second gripper; a delicate take-over in which particle generation is prevented or at least minimized. FIG. 5c shows that the mask is held only by the second gripper of which protrusion 32 is inserted in groove 34a. Protrusions 31, 32 are shown as thin poles having a ball on top so as to have some resilience in a plane parallel to the mask (and perpendicular to protrusions 31, 32), as depicted by the double arrows in FIG. 5b for protrusion 31. The resilience allows easy adaption of the protrusions to a kinematically-determined position determined by cooperation of the pins and grooves, and assures an even more gentle take-over.

In FIG. 1 the lithographic apparatus is only schematically shown. In a practical apparatus the mask table may be mounted such that the mask pattern will be facing downward. The mask MA may then be held by electrostatic forces at its back for holding it against gravity and acceleration and deceleration forces of mask table MT. A mask gripper as discussed above is used to transport the mask to the mask table. When brought below the mask table, a take-over should take place to transfer the mask to the mask table. During such take-over a relative movement of mask table and gripper will generally occur. If the mask were to be taken directly to the mask-bearing surface of the mask table on which it is to be held by an electrostatic force, slip between the mask-bearing surface and the backside of the mask will occur. This will cause particle generation and the generated particle will become trapped in between mask and mask-bearing surface to cause mask deformation on a scale that is not tolerable in an EUV lithographic apparatus.

Figure 6:
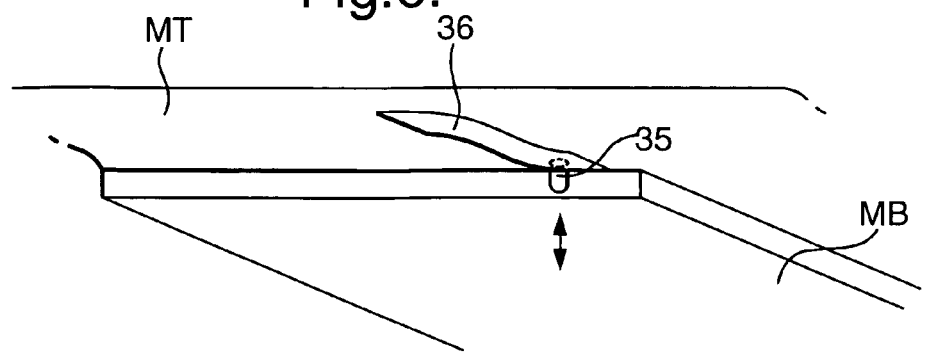
FIG. 6 depicts part of a mask table incorporating a gripper according to an embodiment of the invention.

To prevent such slippage movement during take-over, pins 35 are provided on respective leaf springs 36 that are mounted to the mask table, as shown in FIG. 6, so as to allow movement in a vertical Z direction (as depicted by the double arrow in FIG. 6), but not to allow movement in a horizontal XY plane. On the other hand, pins 21b, 31, 32 that are mounted to the gripper are constructed such as to be resilient in the XY plane but rigid in the Z direction, as is shown for pins (protrusions) 31, 32 depicted in FIGS. 5a, 5b and 5c. The degrees of freedom of pins 35 on the mask table are therefore complementary to the degrees of freedom of pins 21b, 31, 32 of the gripper. Pins 35 in FIG. 6 are schematically depicted to have a rounded top. Other constructions of pins 31, 32, 35 to allow for the respective degrees of freedom may also be envisaged.

During take-over the mask is brought towards the mask table by the gripper having pins 21b, 31 or 32. Subsequently, the gripper with the mask will be raised (or the mask table lowered) for the pins 35 of the mask table to make contact with their respective grooves 1a provided on the mask. The mask is then restricted to move perpendicular to mask table MT, but not parallel to it. Take-over will be completed by electrostatic attraction of mask MA against the mask-bearing surface MB of mask table MT.

Any surfaces of pins and respective grooves are preferably of a material that is very resistant to wear, i.e. (very) hard and non-brittle materials that are (substantially) not reactive. The pins and grooves can be made of or in such materials or may be coated with such materials. Examples of such materials and coatings are diamond-like coatings (DLC coatings), silicon nitride, titanium nitride, etceteras.

Figure 7:
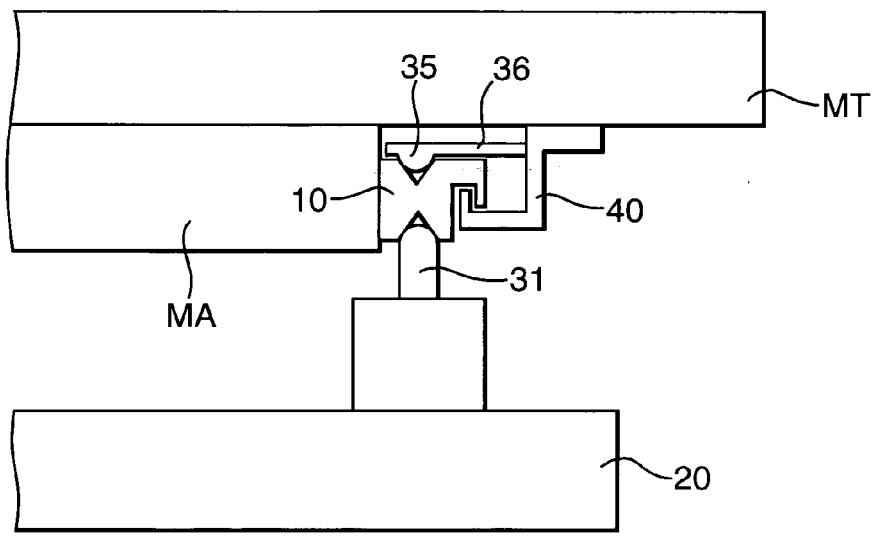
FIG. 7 depicts a fail-safe arrangement incorporated in the mask table and a bracket provided on a mask according to an embodiment of the invention.

When mask MA is held on mask table MT employing an electrostatic force, some safety arrangement may be provided to prevent the mask from falling down during a power failure. To this end a safety bracket 40 is mounted on the mask table. Safety bracket 40 is shaped for cooperation with an appropriately shaped bracket 10 mounted on mask MA, as is schematically depicted in FIG. 7.

Figure 8:
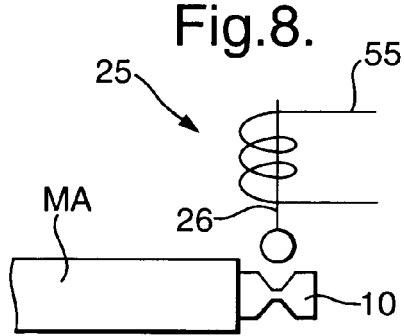
FIGS. 8 and 9 depict other types of grippers according to embodiments of the invention.

So far, the gripper has been described such that the mask is held on the gripper by a gravity force. In handling it may be required to have a gripper 25 coming from above, for instance, for take-over of the mask to another part of the apparatus or to lower the mask in a mask storage box. Such a gripper 25 will have downward oriented pins for cooperation with upwards oriented grooves. Electromagnetic holding apparatus may be provided to hold mask MA against the pins. To this end the gripper may be provided with means to electrostatically hold mask MA against gripper 25 as it is held against mask table MT. Another option would be to make brackets 10 of a magnetic or magnetizable material (for instance, martensitic stainless steel) and to include an electric coil 55 in the complementary gripper, as is schematically depicted in FIG. 8. An electric current flowing through the coil will induce a magnetic field attracting the bracket of magnetic or magetizable material. FIG. 8 also shows protrusions 26 of gripper 25 to be resilient in a plane parallel to mask MA for gentle take-over of the mask.

Figure 9:
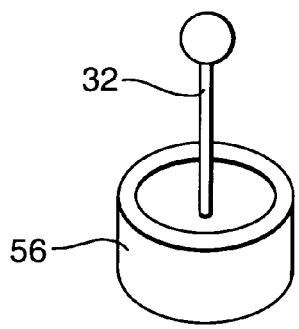

The magnetic field of coil 55 will also act to attract any contaminant particles of magnetic or magnetizable material that may become released due to mechanical contact of gripper and mask. A permanent magnet or electromagnet may also be mounted near protrusions of grippers, which do not employ a magnetic field to hold the mask, so as to attract contaminant particles for further reducing the risk of contamination of the mask. FIG. 9 shows a pin and a permanent magnet 56 of a gripper, which is not further shown, for attracting particles released during mechanical contact made. Such a provision of a magnet (permanent magnet or electromagnet) is not limited to the type of gripper disclosed here, but may be provided with any type of gripper to avoid contamination of the mask.

Figure 10:
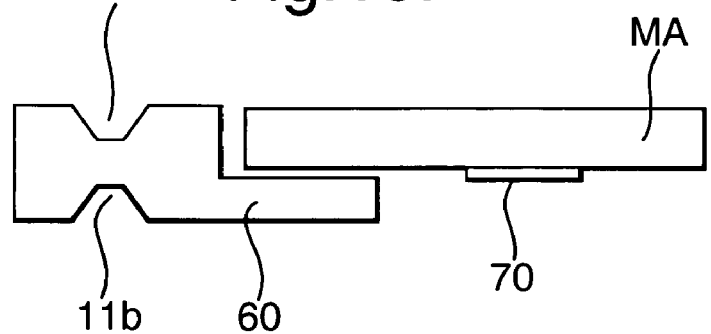

FIG. 10 depicts another embodiment of the invention for handling the mask. In this embodiment the mask is mounted in a frame 60 that is provided with recesses 11a, 11b for handling. The mask may be mounted by gravity in the frame or by some appropriate clamp (not shown). Pads of a magnetic or magnetizable material may be provided at selected parts on the mask for contact with some type of gripper to mount the mask into the frame or to handle it otherwise. Particles released from the metal pad can be attracted by a magnetic field as described above to prevent particle contamination of the mask.

Figure 11:
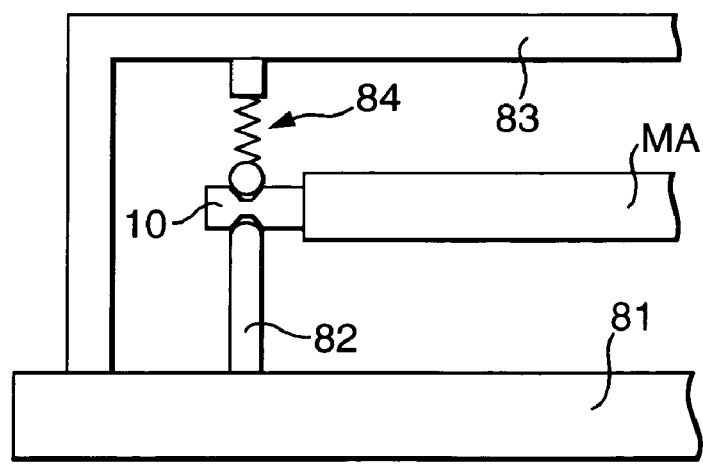
FIG. 11 depicts a detail of a mask storage box according to an embodiment of the invention.

The mask gripper disclosed as a part of the lithographic projection apparatus of FIG. 1 may also be a part of other tools, such as a multilayer deposition apparatus, a mask writing apparatus, a mask cleaning apparatus, or a mask inspection apparatus, or part of a reticle storage box. FIG. 11 schematically depicts part of a reticle storage incorporating top and bottom grippers according to the invention. The bottom gripper is constituted by bottom plate 81 supporting three pins 82 having rounded tops for cooperation with a bottom V-groove in brackets 10 of mask MA. The top gripper is constituted by cover 83 of the box that supports three protrusions 84 gaving a spring and ball for cooperation with top V-grooves in brackets 10 of mask MA. A spring may also be provided in protrusion 82 to suppress acceleration forces. Bottom plate 81 and cover 83 may be made of polished aluminum, a low outgassing material. Inside the box an atmosphere of a protective (inert) gas is maintained.

While we have described above specific embodiments of the invention, it will be appreciated that the invention may be practiced otherwise than as described. The description is not intended to limit the invention. For example, the protrusions may extend from the mask while the grooves are provided in the gripper.

The invention claimed is:

1. A method of handling a reflective mask suitable for patterning a projection beam of extreme ultraviolet electromagnetic radiation in a lithographic projection apparatus, comprising:

handling the mask;

holding the mask while handling the mask such that the mask is self-aligning in a horizontal direction, the holding comprising cooperation between a first set of connecting structures on the mask and a respective second set of connecting structures on a gripper such that a contact area between the mask and the gripper is minimized.

2. A method according to claim 1, wherein the first set of connecting structures comprises one of the group comprising a set of projections and a set of recesses, and the second set of connecting structures comprises the other one of the group.

3. A method according to claim 2, wherein said set of recesses comprises grooves that are substantially oriented towards a common point.

4. A method according to claim 2, wherein said recesses are provided in respective brackets provided around said mask.

5. A method according to claim 2, wherein said mask is provided with at least two sets of recesses adapted for cooperation with respective sets of protrusions of separate grippers.

6. A method according to claim 1, wherein said holding further comprises holding the mask by employing a non-contact force, selected from gravity, an electromagnetic force and combinations thereof.

7. A method according to claim 1, wherein said method further comprises:
   transferring the mask from the gripper to a transfer gripper, the transferring comprising:
      moving said transfer gripper into position such that the first set of connecting structures contact a cooperating set of transfer connecting structures in the transfer gripper; and
      holding said mask with said transfer gripper by cooperation of said first set of connecting structures with said cooperating set of transfer connecting structures.

8. A method according to claim 1, wherein said method further comprises holding said mask with two grippers, each gripper comprising a respective set of connecting structures which are constructed and arranged to cooperate with a respective set of connecting structures provided in said mask, degrees of freedom of the set of connecting structures of each gripper being complementary to degrees of freedom of the set of connecting structures of the other gripper.

9. A method of handling a reflective mask suitable for patterning a projection beam of extreme ultraviolet electromagnetic radiation in a lithographic projection apparatus comprising:
   kinematically-determined holding said mask while handling, said kinematically-determined holding comprising cooperation of a set of structures on a gripper with a respective set of structures provided in a circumferential region of the mask, said structures selected from the group comprising protrusions and recesses;
   wherein the mask is self-aligning in a horizontal direction.

10. A method according to claim 9, wherein said holding further comprises holding the mask by employing a non-contact force, selected from gravity, an electromagnetic force and combinations thereof.

11. A method according to claim 9, wherein said method further comprises:
   transferring the mask from the gripper to a transfer gripper, the transferring comprising:
      moving said transfer gripper into position such that the set of structures of the mask contact a cooperating set of structures in the transfer gripper; and
      holding said mask with said transfer gripper by cooperation of said set of structures of the mask with said cooperating set of structures in the transfer gripper.

12. A method according to claim 9, wherein said method further comprises holding said mask with two grippers, each gripper comprising a respective set of structures which are constructed and arranged to cooperate with a respective set of structures provided in said mask, degrees of freedom of the set of structures of each gripper being complementary to degrees of freedom of the set of structures of the other gripper.

13. A method according to claim 9, wherein said set of recesses comprises grooves that are substantially oriented towards a common point.

14. A method according to claim 9, wherein said recesses are provided in respective brackets provided around said mask.

15. A method according to claim 9, wherein said mask is provided with at least two sets of recesses adapted for cooperation with respective sets of protrusions of separate grippers.

16. A method of positioning a mask with respect to a mask gripper, the mask having an imaging portion and locating surfaces fixed with respect to the imaging portion, the gripper having cooperating locating surfaces that can engage the mask locating surfaces comprising:
   engaging the gripper locating surfaces with the mask locating surfaces so as to position the imaging portion with respect to the gripper;
   maintaining the engagement with a non-contact force applied to the mask;
   wherein the mask is self-aligning in a horizontal direction.

17. A method as in claim 16 wherein the force is an electromagnetic force.

18. A method as in claim 16 wherein the force is gravitational.

19. A method according to claim 16, wherein the gripper locating surfaces comprises one of the group comprising a set of projections and a set of recesses, and the mask locating surfaces comprises the other one of the group.

20. A method according to claim 19, wherein said set of recesses comprises grooves that are substantially oriented towards a common point.

21. A method according to claim 19, wherein said recesses are provided in respective brackets provided around said mask.

22. A method according to claim 19, wherein said mask is provided with at least two sets of recesses adapted for cooperation with respective sets of protrusions of separate grippers.

23. A method according to claim 16, wherein said method further comprises:
   transferring the mask from the gripper to a transfer gripper, the transferring comprising:
      moving said transfer gripper into position such that the mask locating surfaces contact a cooperating set of locating surfaces in the transfer gripper; and
      holding said mask with said transfer gripper by cooperation of said mask locating surfaces with said cooperating set of locating surfaces in the transfer gripper.

24. A method according to claim 16, wherein said method further comprises holding said mask with two grippers, each gripper comprising a respective set of locating surfaces which are constructed and arranged to cooperate with a respective set of locating surfaces provided in said mask, degrees of freedom of the set of locating surfaces of each gripper being complementary to degrees of freedom of the set of locating surfaces of the other gripper.

* * * * *